(12) United States Patent
Borisch

(10) Patent No.: US 6,506,110 B1
(45) Date of Patent: Jan. 14, 2003

(54) VENTILATION DEVICE, ESPECIALLY FOR ELECTRICAL CONTROL DEVICES

(75) Inventor: Wolfgang Borisch, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/584,054

(22) Filed: May 30, 2000

Related U.S. Application Data

(63) Continuation of application No. PCT/DE98/02415, filed on Aug. 19, 1998.

(30) Foreign Application Priority Data

Nov. 28, 1997 (DE) .......................................... 197 52 966

(51) Int. Cl.[7] ................................................ H05K 7/20
(52) U.S. Cl. .................. 454/184; 174/17 VA; 361/678; 454/254
(58) Field of Search ........................ 454/69, 184, 254; 174/17 VA; 361/678, 690

(56) References Cited

U.S. PATENT DOCUMENTS

| | | | | |
|---|---|---|---|---|
| 2,515,950 A | * | 7/1950 | Dingman | ..................... 454/184 |
| 2,607,280 A | * | 8/1952 | Purdy | ......................... 454/184 |
| 2,859,270 A | * | 11/1958 | Patchin | ................... 454/254 X |
| 3,696,729 A | * | 10/1972 | Chabala et al. | ............. 454/184 |
| 4,639,818 A | | 1/1987 | Cherian | |
| 4,734,315 A | * | 3/1988 | Spence-Bate | |
| 4,889,542 A | | 12/1989 | Hayes | |
| 5,642,935 A | | 7/1997 | Schmitt | |
| 5,649,859 A | * | 7/1997 | Shiga | .................. 174/17 VA X |
| 5,692,637 A | * | 12/1997 | Hodge | ................. 174/17 VA X |
| 5,775,794 A | | 7/1998 | Schmitt | |
| 6,008,454 A | * | 12/1999 | Kawakita | ................ 361/690 X |

FOREIGN PATENT DOCUMENTS

| | | | | |
|---|---|---|---|---|
| DE | 34 25 418 A | * | 1/1966 | ................. 361/678 |
| DE | 74 07 205 | | 10/1975 | |
| DE | 32 20 704 A1 | | 12/1983 | |
| DE | 37 16 912 A1 | | 12/1988 | |
| DE | 295 052 A | * | 10/1991 | ................. 361/690 |
| DE | 91 15 939 | | 3/1992 | |
| DE | 42 34 919 C2 | | 4/1994 | |
| EP | 0 377 067 A1 | | 7/1990 | |
| WO | WO 96/03629 | | 2/1996 | |

* cited by examiner

*Primary Examiner*—Harold Joyce
(74) *Attorney, Agent, or Firm*—Laurence A. Greenberg; Werner H. Stemer; Gregory L. Mayback

(57) ABSTRACT

A ventilation device for electrical control devices is provided in a housing wall of a housing. The ventilation device includes a wall with an inner opening that is open with respect to the space inside the housing and is intended for receiving and delivering a gas from and to the space inside the housing. The wall of the device also includes an outer duct opening that is open with respect to the housing surroundings and is intended for receiving and delivering a gas from and to the housing surroundings. The inner opening and the outer duct opening are connected to each other for leading the gas between the openings through a ventilation duct unit in which a membrane unit is disposed. The inner opening and the outer duct opening are offset laterally with respect to each other such that they do not overlap each other.

9 Claims, 2 Drawing Sheets

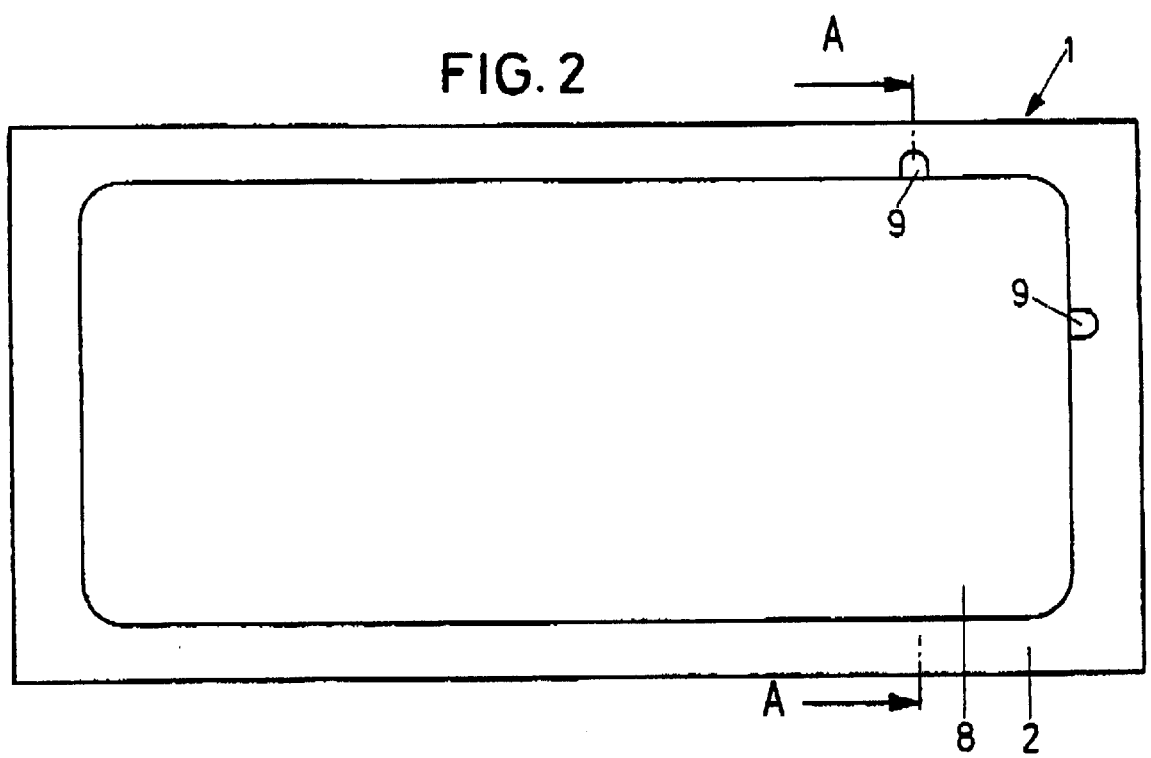
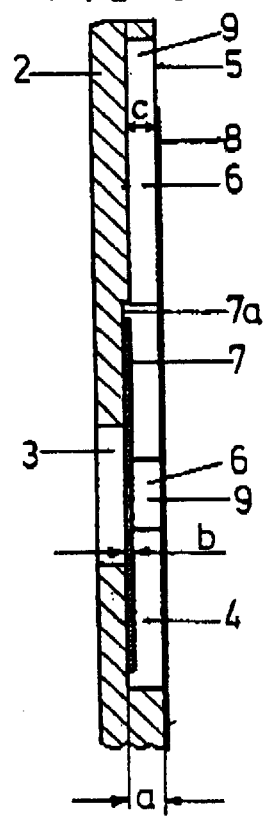

VENTILATION DEVICE, ESPECIALLY FOR ELECTRICAL CONTROL DEVICES

CROSS-REFERENCE TO RELATED APPLICATION

This is a continuation of copending International Application PCT/DE98/02415, filed Aug. 19, 1998, which designated the United States.

BACKGROUND OF THE INVENTION

FIELD OF THE INVENTION

The invention relates to a ventilation device. Ventilation devices of the type according to the invention serve for ventilating and venting spaces inside housings of electrical control devices, especially for automotive applications.

One ventilation device is disclosed in German Utility Model G 91 15 939.3 U. That ventilation device has a connecting piece integrally bonded to the housing by frictional welding in a receiving opening in a wall of an electrical device housing. A pressure-compensating element, which includes a carrier plate, an outer plate, and a membrane located between the plates and which is joined together in one piece by ultrasonic welding, is fixed in the connecting piece by frictional welding. The pressure-compensating element is protected, especially against mechanical damage, by a cover fitted on the connecting piece. The cover has openings, through which a gas can flow, to the region of the membrane. The ventilation device is complicated in construction and complex to produce.

International PCT publication WO 96/03629 discloses a ventilation device with a protective membrane for a silicon pressure sensor. In the device, a hollow space and a membrane are provided above a silicon chip to be protected and ventilated. An annular covering fixes the membrane. The annular covering is resilient, especially to compensate for temperature fluctuations. The ventilation device is also complicated in its construction and is expensive to produce.

SUMMARY OF THE INVENTION

It is accordingly an object of the invention to provide a ventilation device that overcomes the hereinafore-mentioned disadvantages of the heretofore-known devices of this general type and that can be produced in a simple and cost-effective manner.

With the foregoing and other objects in view, there is provided, in accordance with the invention, a ventilation device including a wall having at least one inner opening open to an inner space of the wall for receiving and delivering gas from and to the inner space, at least one outer opening open to the surroundings for receiving and delivering gas from and to the surrounding, the at least one inner opening and the at least one outer opening laterally offset to not overlap, a ventilation duct unit fluidically connecting the at least one inner opening to the at least one outer opening for leading the gas between the at least one inner opening and the at least one outer opening, and a membrane unit disposed in the ventilation duct unit.

The invention has the advantage that spray water directed onto the housing from outside can at most penetrate the outer duct opening, but generally cannot penetrate the inner opening. Such is true because the two openings are not disposed in line. Consequently, water must first penetrate the ventilation duct unit. Penetration is difficult because the ventilation duct unit, which is disposed in the wall of the housing, extends essentially perpendicular to the spray water impingement direction.

In accordance with another feature of the invention, there is provided a covering layer bonded to the wall.

In accordance with a further feature of the invention, the ventilation duct unit includes a depression disposed in the wall surrounding the inner opening, and includes at least one ventilation duct formed as a recess in the wall, fluidically connected to the depression, and extending away from the depression.

In accordance with an added feature of the invention, the covering layer covers the inner opening, the recess, and at least part of the ventilation duct.

In accordance with an additional feature of the invention, the covering layer does not cover an end of the ventilation duct.

In accordance with yet another feature of the invention, the at least one outer opening is an end of the ventilation duct remote from the depression and is not covered by the covering layer.

In accordance with yet a further feature of the invention, the membrane unit has a gas-permeable membrane, and the gas-permeable membrane has at least one property selected from the group consisting of hydrophobic and oliophobic.

In accordance with yet an added feature of the invention, the covering layer is one of the group consisting of a company plate, a type identification plate, and a print carrier. It is particularly advantageous that type identification plates, which are typically fitted on electrical devices, at the same time form a wall of the ventilation duct unit. Membranes can be inserted and exchange in a simple manner because they are merely attached adhesively into a depression, which presents no problems before fitting the type identification.

In accordance with yet an additional feature of the invention, the outer opening is disposed at a level lower than the membrane unit.

In accordance with again another feature of the invention, the ventilation duct is at least two ventilation ducts extending outward essentially radially from the inner opening and essentially perpendicularly to each other.

The ventilation duct device may advantageously be configured such that the outer duct openings are disposed in the direction of gravity below the membrane, so that spray water that has entered is led to the outer duct openings under the effect of gravity.

In accordance with again a further feature of the invention, the depression has a base surface and the membrane unit is adhesively bonded to the base surface.

In accordance with again another feature of the invention, the wall is a housing.

In accordance with a concomitant feature of the invention, the ventilation device is for an electrical control device.

Other features that are considered as characteristic for the invention are set forth in the appended claims.

Although the invention is illustrated and described herein as embodied in a ventilation device, especially for electrical control devices, it is nevertheless not intended to be limited to the details shown because various modifications and structural changes may be made therein without departing from the spirit of the invention and within the scope and range of equivalents of the claims.

The construction and method of operation of the invention, however, together with additional objects and advantages thereof will be best understood from the follow-

BRIEF DESCRIPTION OF THE DRAWINGS

FIG. 2 is a plan view of the ventilation device according to FIG. 1; and

FIG. 3 is a cross-section of the ventilation device of FIG. 2 along line A—A and in a direction indicated by arrows A—A.

DESCRIPTION OF THE PREFERRED EMBODIMENTS

Figure 1:
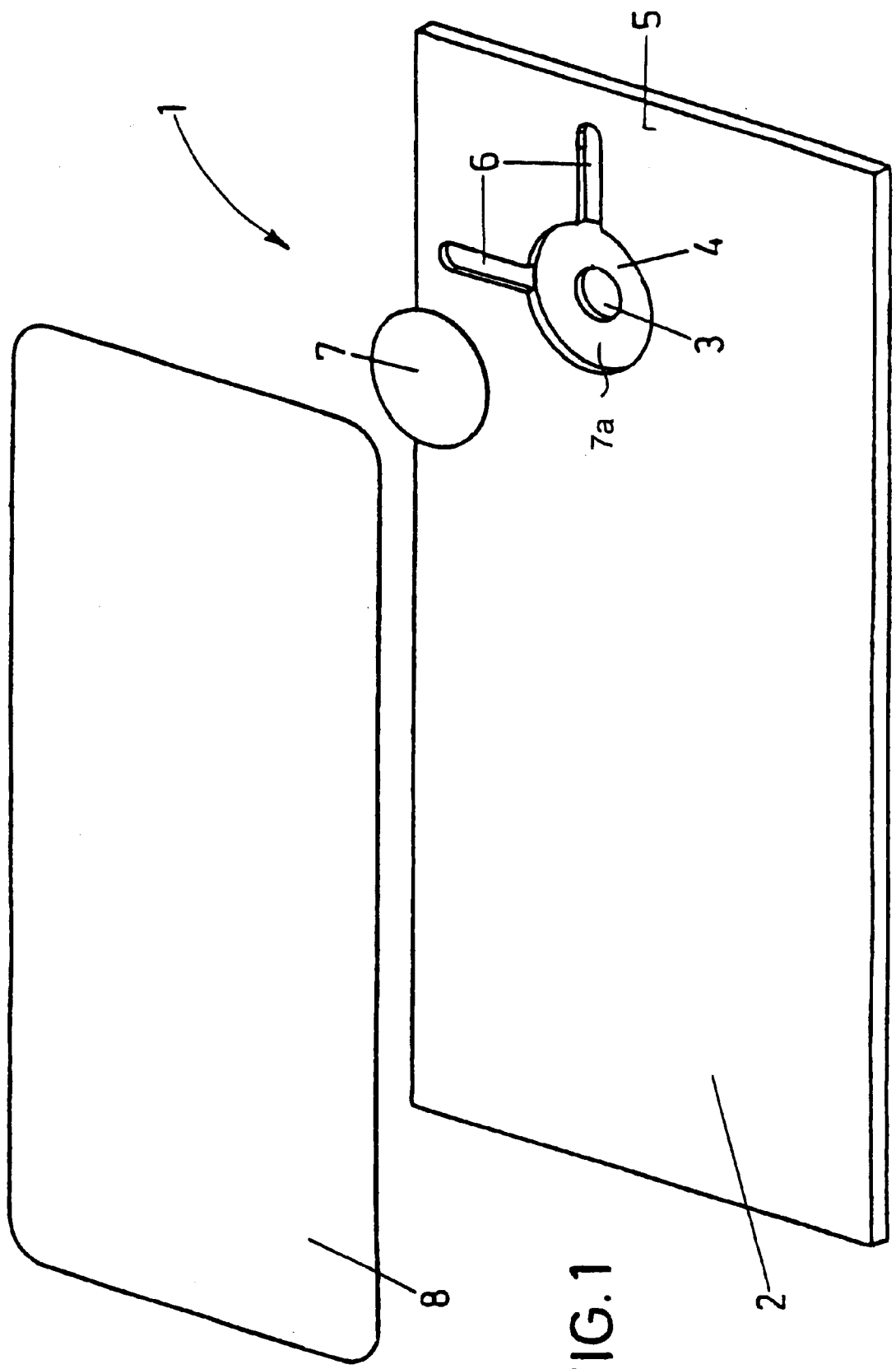
FIG. 1 is an exploded, perspective view of a ventilation device according to the invention.

In all the figures of the drawing, sub-features and integral parts that correspond to one another bear the same reference symbol in each case.

Referring now to the figures of the drawings in detail and first, particularly to FIG. 1 thereof, there is shown a ventilation device 1 for ventilating electrical control devices. The ventilation device has a wall with at least one inner opening open to an inner space of the wall for receiving and delivering gas from and to the inner space. The wall also has at least one outer opening open to the surroundings of the wall for receiving and delivering gas from and to the surroundings.

The ventilation device 1 is provided in a housing wall 2 of the housing for an electrical control device.

The ventilation device 1 ventilates and vents the space inside the housing. In the space inside the housing, pressure differences in relation to the surroundings of the housing are produced due to temperature fluctuations. The ventilation device 1 compensates for such pressure differences. Furthermore, the ventilation device 1 leads water vapor and oil vapors away from the space inside the housing to outside the housing.

Provided in the housing wall 2 is an inner opening 3 that opens the space inside the housing through the housing wall 2 to the surroundings. The inner opening 3 may be a bore or may have already been made during production of the housing.

A depression 4 surrounds the inner opening 3 and is disposed in an outer surface 5 of the housing wall 2. The depression 4 and the inner opening 3 are preferably connected to each other, have a round contour, and are concentric. See FIG. 3. Adjacent to the depression 4 are two ventilation duct 6, which extend outward from the depression 4 as recesses in the outer surface 5. The ventilation ducts 6 essentially extend radially with respect to the inner opening 3 and extend perpendicularly with respect to each other.

A membrane is placed in the depression 4 and is bonded to the base surface 7a of the depression 4 with an adhesive substance or a double-sided adhesive tape. The membrane 7 covers the inner opening 3 and is gas-permeable in the region of the inner opening 3. Therefore, in the region of the inner opening 3, the membrane 7 is not provided with a self-adhesive layer or adhesive substance.

The gas-permeable membrane 7 is additionally hydrophobic, i.e., water-repellent. Preferably, the carrier material for the membrane 7 is a polyester nonwoven. In order to make the nonwoven water-repellent, it is covered with a polyester sulfone polymer. In addition, the membrane 7 may also have oliophobic properties.

To produce the membrane 7, a polysulfone polymer is continuously applied to a polyester nonwoven using a corresponding membrane line. In the continuing process of polymerization, the polysulfone undetachably bonds with the carrier material to form a homogeneous unit.

Typical membranes have an air throughput on average of 400 ml/min/cm² at a differential pressure of 70 mbar, the water ingress point lying at over 1 bar. The water ingress point is the relative pressure, between the space inside the housing and the surroundings, that is required for water to penetrate through the membrane 7. The greatest negative pressure value typically occurring in the space inside housings is approximately 250 mbar. Accordingly, a water ingress point of greater than 1 bar is adequate to ensure that no water enters the space inside the housing.

Other membranes with suitable gas permeability properties are also suitable for use in a ventilation device according to the invention.

If the depth of the depression 4 (measured from the outer surface 5) is denoted by a and the thickness of the membrane 7 is denoted by b, then b<a (b is less than a). See FIG. 3. In other words, a free space up to the outer surface 5 remains above the membrane 7 if the membrane 7 is attached adhesively into the depression 4. The depth c of the ventilation ducts 6, measured from the outer surface 5 towards the inner surface of the housing wall 2, is chosen to correspond to the depth of the free space located above the membrane 7. In other words, c is approximately equal to a–b (a minus b).

The ventilation device 1 has a covering layer 8 on an outer side. The covering layer 8 is bonded in surface-area contact with the housing wall 2. See FIG. 2. The covering layer 8 covers the inner opening 3, the depression 4, and part of the ventilation ducts 6. Specifically, the ends of the ventilation ducts 6 remote from the depression 4, which form the outer duct openings 9, are not covered.

A sticker, especially a sticker identifying a business or manufacturer, is generally used as the covering layer 8 and is adhesively attached to the housing wall 2. The sticker is generally self-adhesive, so that its attachment on the housing wall 2 can be carried out without a problem.

For venting the space inside the housing, air and/or water vapor and/or oil vapors pass through the inner opening 3, penetrate through the membrane 7, and are led through the depression 4 and the ventilation ducts 6 to the outer duct openings 9. For ventilation, air from the surroundings of the housing enters through the outer duct opening 9 and is conducted through the ventilation ducts 6 and the depression 4 to the membrane 7. The membrane 7 is permeable primarily for gases, but not for liquids. Gases pass through the membrane 7 and the inner opening 3 into the space inside the housing. Thus, a negative pressure in the housing, which may have been caused by temperature fluctuations, can be compensated. Spray water that contacts the housing wall 2 or covering layer 8 from the outside is kept away by the covering layer 8. Only very little spray water can pass through the outer duct openings 9 into the depression 4 because the typical direction for spray water to impinge on the surface (i.e., essentially perpendicular to the housing wall 2) is different from the transporting direction of the ventilation ducts 6 (i.e., essentially parallel to the housing wall 2). Nevertheless, should spray water reach the membrane 7, the membrane 7 prevents the liquid from entering the space inside the housing.

Ventilation devices 1 of the type described above may be used for electrical devices, in particular, control devices for automotive applications. Use of devices with stickers, type identification plates, or print carriers is advantageous because the stickers form the covering layer 8. Consequently, both the marking of the device and the covering of the ventilation device 1 take place by one and the same covering layer 8.

Depending on the construction and use of the electrical device, it is possible for the ventilation device 1 to be provided at different locations of the housing, for example, on the underside or the side surfaces of the housing. Providing a ventilation device 1 in an elevated position, with ventilation ducts 6 running obliquely downward in the direction of gravity, is also appropriate. Accordingly, spray water entering, for example, due to wind, can be led away using gravity, which speeds up the membrane 7 drying process and further reduces the probability of water entering the space inside the housing.

The materials for forming a ventilation device 1, i.e. from which the housing wall 2 is formed, may be chosen as desired.

Polymers are preferably used, so that, during the production of the housing, the inner opening 3, the depression 4, and the ventilation ducts 6 can be formed at the same time.

A preferred area of use for a ventilation device 1 according to the invention is the automotive sector.

I claim:

1. A ventilation device, comprising:
    a wall defining an inner space and surroundings and having:
        at least one inner opening open to said inner space for receiving and delivering gas from and to said inner space;
        at least one outer opening open to the surroundings for receiving and delivering gas from and to the surroundings, said at least one inner opening and said at least one outer opening laterally offset to not overlap;
        a depression disposed in said wall surrounding said at least one inner opening; and
        at least one ventilation duct formed as a recess in said wall and having a distal end, fluidically connected to said depression, and extending away from said depression, for leading the gas between said at least one inner opening and said at least one outer openting;
    a membrane unit disposed in said depression; and
    a covering layer attached to said wall and juxtapositioned inside of the distal end of said at least one ventilation duct to form said at least one outer opening.

2. The ventilation device according to claim 1, wherein said covering layer covers said at least one inner opening, said recess, and at least part of said at least one ventilation duct.

3. The ventilation device according to claim 2, wherein said covering layer does not cover an end of said at least one ventilation duct.

4. The ventilation device according to claim 2, wherein said at least one outer opening is an end of said at least one ventilation duct remote from said depression and is not covered by said covering layer.

5. The ventilation device according to claim 2, wherein said at least one outer opening is disposed at a level lower than said membrane unit.

6. The ventilation device according to claim 1, wherein said at least one ventilation duct is at least two ventilation ducts extending outward essentially radially from said at least one inner opening and essentially perpendicularly to each other.

7. The ventilation device according to claim 1, wherein said depression has a base surface and said membrane unit is adhesively bonded to said base surface.

8. The ventilation device according to claim 1, wherein said membrane unit has a gas-permeable membrane, and said gas-permeable membrane has at least one property selected from the group consisting of hydrophobic and oliophobic.

9. The ventilation device according to claim 1, wherein said wall is the wall of a housing.

* * * * *